United States Patent [19]
Redig et al.

[11] Patent Number: 4,813,005
[45] Date of Patent: Mar. 14, 1989

[54] DEVICE FOR SYNCHRONIZING THE OUTPUT PULSES OF A CIRCUIT WITH AN INPUT CLOCK

[75] Inventors: Michael J. Redig; David M. Prater, both of Loveland, Colo.

[73] Assignee: Hewlett-Packard Company, Palo Alto, Calif.

[21] Appl. No.: 65,971

[22] Filed: Jun. 24, 1987

[51] Int. Cl.[4] ............... G05B 19/02; H03D 3/24; H03L 7/00; H03L 7/08

[52] U.S. Cl. ................... 364/580; 375/120; 331/1 R; 331/25

[58] Field of Search ........... 364/580, 550; 375/119, 375/120; 331/1 R, 1 A, 25

[56] References Cited
U.S. PATENT DOCUMENTS

| | | | |
|---|---|---|---|
| 4,145,667 | 3/1979 | Messerschmitt | 331/25 |
| 4,166,979 | 9/1979 | Waggener | 375/120 |
| 4,215,430 | 7/1980 | Johnson, Jr. | 375/120 |
| 4,225,828 | 9/1980 | Watanabe et al. | 331/25 |
| 4,518,998 | 5/1985 | Warner | 331/25 |
| 4,646,030 | 2/1987 | Hollister | 331/1 A |
| 4,698,601 | 10/1987 | Aizawa | 331/1 A |

OTHER PUBLICATIONS

McCarthy et al., High-Frequency Analog Electronic Delay Using Phase-Locked-Loop Techniques, IBM Technical Disclosure Bulletin, vol. 19, No. 8, 2/77, p. 3131-3132.

Primary Examiner—Parshotam S. Lall
Assistant Examiner—Tuan A. Duong
Attorney, Agent, or Firm—William W. Cochran

[57] ABSTRACT

A device for synchronizing the output test pattern signals of a test circuit with the clock signal of a device under test (DUT). The invention uses a programmable delay in the feedback loop of a phase locked loop system to adjust the phase of the test pattern signals to be synchronized with the clock of the device under test (DUT).

2 Claims, 2 Drawing Sheets

DEVICE FOR SYNCHRONIZING THE OUTPUT PULSES OF A CIRCUIT WITH AN INPUT CLOCK

BACKGROUND OF THE INVENTION

1. Field of the Invention

The present invention pertains generally to measuring and testing devices and more particularly to a device which is capable of synchronizing test pattern generator pulses with a input clock signal from a board under test.

2. Description of the Background

In the process of performing in-circuit testing of components on a printed circuit board, it is often times necessary to produce a series of output signals comprising test pattern pulses from a pattern generator that are sufficient to properly test the component on the printed circuit board. These predetermined test patterns can be produced from a test pattern generator which contains the desired patterns for testing the components. The output of the test pattern generator is normally connected to a series of drivers which produce the desired output pulses for testing the components on the board.

To perform proper testing of the component, it is necessary to synchronize the output signals from the test pattern generator with input clock pulses from there component, i.e., the device under test (DUT). However, in many cases the input clock pulse from the component cannot be disabled because of the nature of the circuit to which the component is connected. Additionally, the output test pattern pulses are normally retarded in phase compared to the input clock pulses produced by the component by up to 100 nanoseconds or more because of inherent delays in the circuitry which is used to generate the output test pattern pulses. This phase difference between the input clock signal and the output signals can result in faulty test readings of the component. Hence, it is desirable to synchronize the output signal of the test pattern generator with the input clock signal from the component that is being tested to ensure that proper test results are obtained. To date, in-circuit board testers have been unable to provide an adequate means for synchronizing these signals.

SUMMARY OF THE INVENTION

The present invention overcomes the disadvantages and limitations of the prior art by providing a device for synchronizing an outputsignal of an output device, such as a test pattern generator, with an input clock signal from a component under test. This is achieved by utilizing a phase locked loop for generating a reference clock signal that has a phase state that is controlled by a programmable control signal in combination with a phase state indicator for generating a phase state signal which indicates the phase relationship between the input clock signal and the output signal, and processor means for varying the programmable control signal until the phase state signal changes state to alter the phase of the reference clock signal to cause the output signal to be synchronized with the input clock signal.

The advantages of the present invention are that it provides a simple and inexpensive manner of synchronizing an input clock signal with an output test pattern signal in a manner which is independent of the tet pattern generator circuitry that produces shifts in phase. The present invention uses a unique method of varying the phase of a reference clock signal of a phase locked loop by utilizing a programmable delay in the feedback path of the phase locked loop so that the output signal is adjusted in phase to correspond to the phase of the DUT input clock signal. This is achieved by adjusting a programmable delay line in the feedback path of the PLL (phase locked loop) through the use of a phase state indicator until the input clock signal and output signal phases ar synchronized.

DETAILED DESCRIPTION OF THE PREFERRED EMBODIMENT OF THE INVENTION

Figure 1:
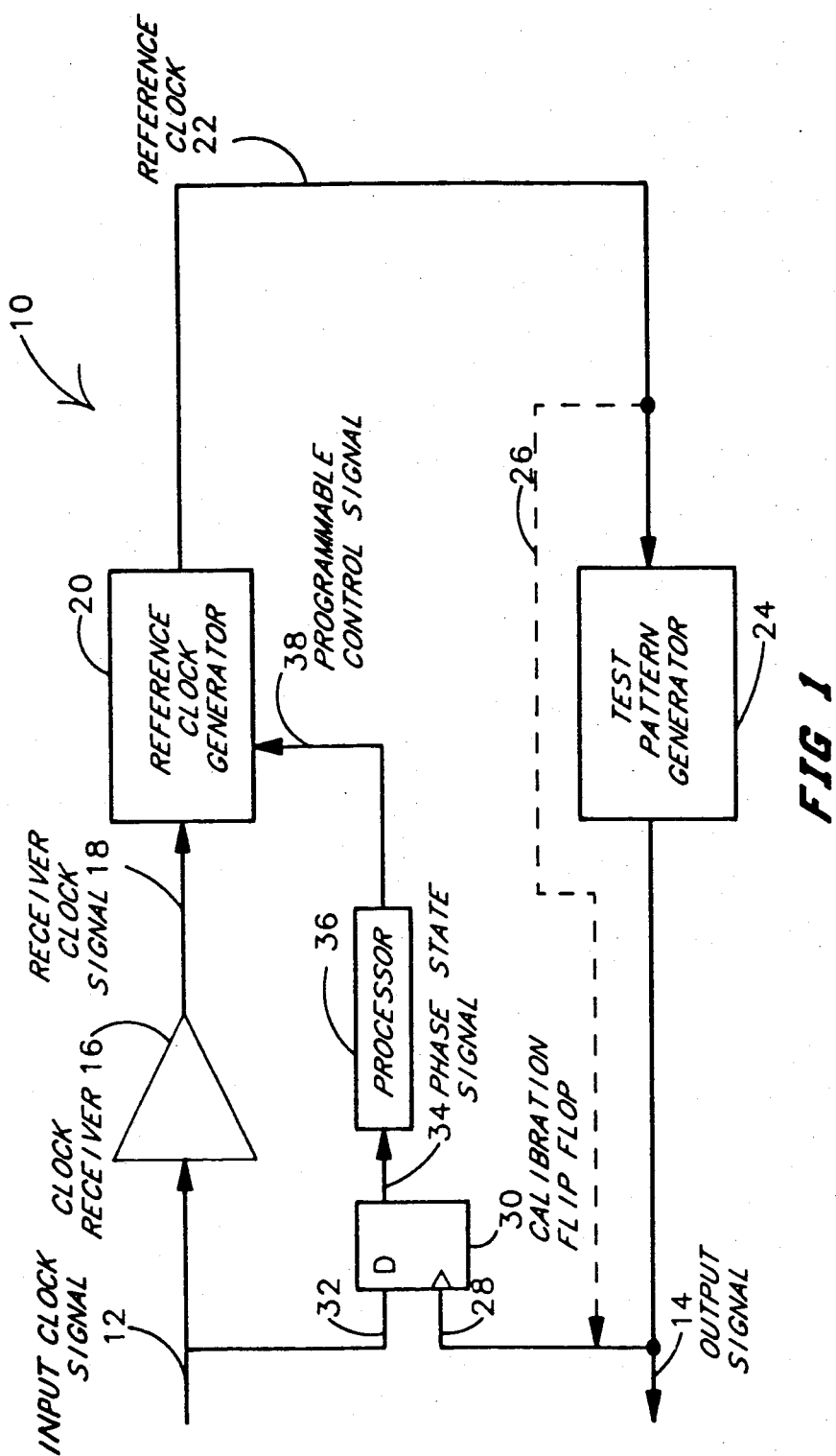
FIG. 1 comprises a schematic illustration of the device of the present invention.

FIG. 1 is a schematic drawing of the device 10 of the present invention. The device under test (not shown) includes a digital component to be tested which has a clock (input clock signal 12) that cannot be disabled during the test of the component. To properly test the component, test pattern signals must be synchronized with the input clock signal 12. Hence, the purpose of the device 10 of the present invention is to receive the input clock signal 12 from the component and synchronize the output test pattern pulses 14 with the input clock signal 12. This is accomplished in the following manner. Input clock signal 12 is received by clock receiver 16, comprising a threshold comparator, to produce a receiver clock signal 18 which, in turn, is applied to reference clock generator 20, comprising the phase locked loop circuit illustrated in FIG. 2. The output of the phase locked loop 20 comprises a reference clock signal 22 which functions as a clocking signal that is applied to the test pattern generator 24 that synchronously generates a series of output test patterns which are used to test the component for proper operation. The test pattern generator 24 may comprise a Random Access Memory (RAM) device wherein the desired test pattern is stored at sequential address locations. A counter, (not shown) forming part of the test pattern generator 24, accumulates the reference clock pulses which are used as a sequential address to provide the desired test pattern output. The test pattern output from test pattern generator 24 is then used to stimulate the component under test. Output signal 14 is applied to the flip flop clocking input 28 of calibration flip flop 30. Alternatively, the reference clock 22 can be applied to the calibration flip flop 30 by way of path 26 and a computed offset can be introduced to compensate for the delay of test pattern generator 24 within predicted limits. The input clock signal 12 is applied to the data input 32 of calibration flip flop 30. As a result, a phase state signal 34 is produced at the output of the calibration flip flop 30. The phase state signal 34 is high only when data input 32 is high before the flip flop clocking input 28 goes high. Hence, as long as the input clock signal 12 occurs prior to output pulse 14, the phase state signal 34 will remain high. However, when the output signal 14 occurs prior to input clock 12, the phase state signal 34 will be low. In this manner, the phase state signal 34 can provide an indication of the cross-over point at which the phase of the output signal 14 matches the phase of the input clock signal 12. Alternatively, the data input and clock input can be reversed without affecting the functionality of the invention.

The phase state signal 34 is applied to a processor 35 which detects the phase state signal 34 and generates a programmable control signal 38 which is applied to the reference clock generator (PPL) 20 to adjust the phase of the reference clock 22 in the manner set forth below. The adjustment of the programmable control signal 38 by processor 36 comprises a simple iterative process of increasing or decreasing the value of the programmable control signal until the state of the phase state signal 34 changes, thereby indicating substantial synchronization between input clock 12 and output signal 14.

Figure 2:
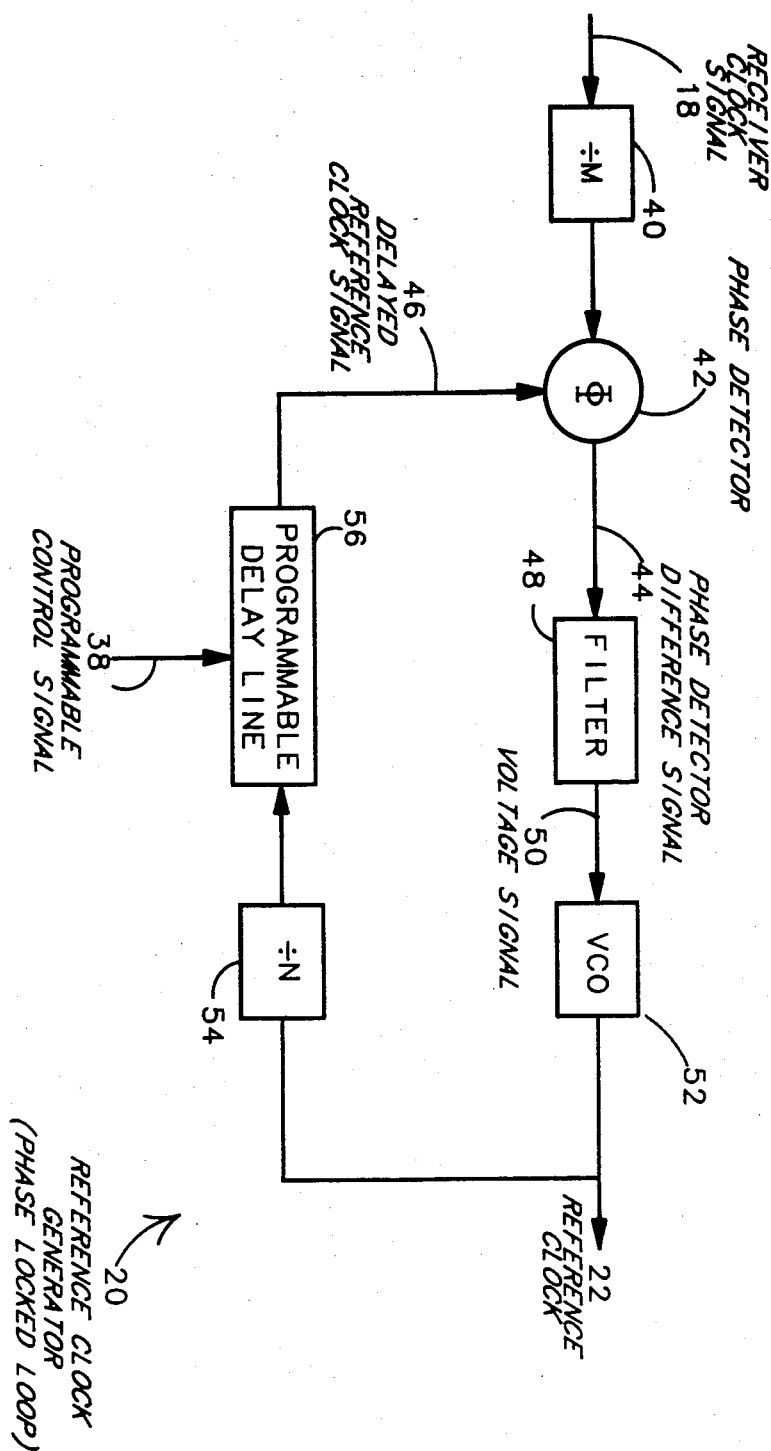
FIG. 2 comprises a schematic illustration of the reference clock generator illustrated in FIG. 1.

FIG. 2 is a schematic block diagram of the reference clock generator 20 illustrated in FIG. 1 which varies the phase of the reference clock 22 in response to the programmable control signal 38 produced by processor 36. Referring to FIG. 2, the receiver clock signal 18 is input to a divide by M circuit 40 which divides the receiver clock signal 18 by a pre-selected number M. The output of the divide by M circuit 40 is applied to a phase detector 42 which produces a phase detector difference signal 44 that has a pulse-width that is proportional to the difference in phase between the input clock signal received from divide by M circuit 40 and the delayed reference clock signal 46.

The phase detector difference signal 44 is applied to filter 48 which comprises an integrator for integrating the phase detector difference signal 44 and producing a voltage signal 50 having a voltage magnitude that is proportional to the difference in phase between the receiver clock signal 18 and the delayed reference clock signal 46. The voltage signal 50 is applied to a voltage controlled oscillator 52 which produces reference clock 22 having a frequency proportional to the voltage of voltage signal 50. Reference clock signal 22 is then applied to a divide by N circuit 54 which in turn applies the divided reference clock 22 to programmable delay line 56. Programmable delay line 56 functions to introduce a delay in accordance with a programmable control signal 38. As delays are added to the reference clock 22 by programmable delay line 56, the phase detector difference signal 44 momentarily increases thereby momentarily increasing voltage signal 50 causing voltage control oscillator 52 to momentarily increase its frequency to offset the difference in phase detected by phase detector 42. Hence, as more delay is added to programmable delay line 56 by way of programmable control signal 38, the phase of the reference clock is advanced. In this manner, as processor 36 (FIG. 1) proceeds through an iterative process of increasing the programmable control signal, the phase of the reference clock 22 is advanced until output signal 14 is in-phase with input clock signal 12. Referring to FIG. 1, this causes the phase state signal 34 to go from a high state to a low state signalling the processor to stop the iterative process of introducing delay through the programmable delay line 56 (FIG. 2) so as to halt the further advance in phase of the reference clock signal 22.

Hence, the output signal 14 can be synchronized with a high degree of accuracy with the input clock signal 12 by introducing delays in the feedback circuit of a phase lock loop which generates the reference clock signals for the test pattern generator 24. Resolution dependent only on the resolution of the programmable delay line can be achieved with a high degree of accuracy without the necessity for complex and expensive control circuitry.

The foregoing description of the invention has been presented for purposes of illustration and description. It is not intended to be exhaustive or to limit the invention to precise form disclosed, and other modifications and variations may be possible in light of the above teachings. For example, the present invention need not be restricted to testing devices or instrumentation, but can be used with any circuitry where phase or time relationships must be controlled or measured, such as in radar systems, navagational systems, ultrasound imagers, etc. The embodiment was chosen and described in order to best explain the principles of the invention and its practical application to thereby enable others skilled in the art ot best utilize the invention in various embodiments and various modifications as are suited to the particular use contemplated. It is intended that the appended claims be construed to include other alternative embodiments of the invention except insofar as limited by the prior art.

What is claimed is:

1. A device for producing a reference clock signal in a phase lock loop that synchronizes the phase of an output signal, produced by an output device in response to said reference signal, with an input clock signal produced by an external component comprising:
   phase detector means for generating a difference signal proportional to the difference in phase between said input clock signal and a delayed reference clock signal produced by delaying said reference clock signal by a predetermined amount;
   filter means coupled to said phase detector means for integrating said difference signal and producing a voltage signal proportional to an integrated value of said difference signal;
   voltage controlled oscillator means coupled to said filter means for producing said reference clock signal having a frequency proportional to said voltage signal produced by said filter means;
   programmable delay means coupled to said voltage controlled oscillator means for delaying said reference clock signal by said predetermined amount in response to a programmable delay signal to produce said delayed reference clock signal;
   phase state indicator means coupled to said input clock signal and said output signal for producing a phase state signal that indicates the phase relationship of said input clock signal and said output signal;
   processor means for varying said programmable delay signal in response to said phase state signal to alter the phase of said reference clock signal until said phase state signal produced by said phase state indicator means changes state indicating that said input clock signal and said output signal are in-phase.

2. The device of claim 1 wherein said phase state indicator means comprises a flip flop having a data input connected to said input clock signal and a clock input connected to said output signal so that whenever said output signal is retarded in phase in comparison to said input signal, said phase state signal produced by said flip flop is in a high state, and whenever said output signal is advanced in phase in comparison to said input signal, said phase state signal is in a low state.

* * * * *

UNITED STATES PATENT AND TRADEMARK OFFICE
CERTIFICATE OF CORRECTION

PATENT NO. : 4,813,005
DATED : March 14, 1989
INVENTOR(S) : Michael J. Redig and David M. Prater It is certified that error appears in the above-identified patent and that said Letters Patent is hereby corrected as shown below:

Column 1, line 10, "a input" should be -- an input --;

Column 1, line 27, "there component" should be -- the component --;

Column 1, line 37, "output signals" should be -- output signal --;

Column 1, line 48, "outputsignal" should be -- output signal --;

Column 1, line 57, after "signal", "until the phase state signal changes state" should be moved to Column 1, line 59 after "signal";

Column 1, line 64, "tet" should be -- test --;

Column 2, line 7, "ar" should be -- are --;

Column 3, line 1, "processor 35" should be -- processor 36 --;

Column 4, line 16, "ot" should be -- to --;

Signed and Sealed this

Twenty-first Day of August, 1990

*Attest:*

HARRY F. MANBECK, JR.

*Attesting Officer*  *Commissioner of Patents and Trademarks*